(12) United States Patent
Park et al.

(10) Patent No.: US 9,995,458 B2
(45) Date of Patent: Jun. 12, 2018

(54) CERAMIC PHOSPHOR PLATE AND LIGHTING DEVICE INCLUDING THE SAME

(71) Applicant: LG INNOTEK CO., LTD., Seoul (KR)

(72) Inventors: Jin Gyeong Park, Seoul (KR); Won Jin Kim, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 117 days.

(21) Appl. No.: 14/594,305

(22) Filed: Jan. 12, 2015

(65) Prior Publication Data

US 2015/0198303 A1    Jul. 16, 2015

(30) Foreign Application Priority Data

Jan. 13, 2014 (KR) .................. 10-2014-0004003
Jan. 22, 2014 (KR) .................. 10-2014-0007764

(51) Int. Cl.
*F21V 9/16* (2006.01)
*C09K 11/02* (2006.01)
*C09K 11/08* (2006.01)
*H01L 33/50* (2010.01)

(52) U.S. Cl.
CPC ............. *F21V 9/16* (2013.01); *C09K 11/02* (2013.01); *C09K 11/08* (2013.01); *H01L 33/505* (2013.01); *H01L 33/504* (2013.01); *H01L 2224/48091* (2013.01); *Y10T 428/24926* (2015.01); *Y10T 428/252* (2015.01)

(58) Field of Classification Search
None
See application file for complete search history.

(56) References Cited

U.S. PATENT DOCUMENTS

| | | | |
|---|---|---|---|
| 2005/0184638 A1 | 8/2005 | Mueller et al. | |
| 2005/0269582 A1* | 12/2005 | Mueller | C04B 35/44 257/94 |
| 2008/0023712 A1 | 1/2008 | Mueller et al. | |
| 2010/0277673 A1* | 11/2010 | Hoelen | C04B 35/44 349/68 |
| 2012/0111400 A1* | 5/2012 | Wakefield | G02B 1/113 136/256 |
| 2013/0277613 A1* | 10/2013 | Miyagawa | C04B 35/64 252/301.4 R |

FOREIGN PATENT DOCUMENTS

| | | |
|---|---|---|
| WO | WO 2007/080555 A1 | 7/2007 |
| WO | WO 2009/083887 A1 | 7/2009 |
| WO | WO 2009/115998 A2 | 9/2009 |

OTHER PUBLICATIONS

Grant & Hackh's. Chemical Dictionary. Fifth edition., 1987. p. 533.*
European Search Report issued in Application No. 15150941.1 dated Jun. 1, 2015.
European Office Action dated Jan. 4, 2017 issued in Application No. 15150941.1.

* cited by examiner

*Primary Examiner* — Vera Katz
(74) *Attorney, Agent, or Firm* — KED & Associates, LLP (57) ABSTRACT

Provided is a ceramic phosphor plate including a first phosphor layer containing a short-wave phosphor in a transparent ceramic matrix and a second phosphor layer containing a long-wave phosphor, thereby enabling the reduction of a production cost by reducing an amount used of the high-priced long-wave phosphor (red phosphor).

8 Claims, 9 Drawing Sheets

FIG.1

PRIOR ART

CERAMIC PHOSPHOR PLATE AND LIGHTING DEVICE INCLUDING THE SAME

CROSS-REFERENCE TO RELATED APPLICATIONS

This application claims priority under 35 U.S.C. § 119 to Korean Application Nos. 10-2014-0004003, filed on Jan. 13, 2014, and 10-2014-0007764, filed on Jan. 22, 2014, in the Korean Intellectual Property Office, whose entire disclosures are hereby incorporated by reference.

BACKGROUND

1. Field

Embodiments of the present disclosure relate to a lighting device and a phosphor plate constituting the lighting device.

2. Background

Low power/high efficiency light sources use a phosphor as low-wave light sources that emit light in a relatively thin spectrum width, and accordingly, in order to be actually used, the phosphor should be converted into white light. During this conversion process, the problem of a reduction in reliability such as deterioration and decomposition of the phosphor caused by a high temperature/high density and low wavelength beam may be generated. In order to solve such a problem, the study regarding the phosphor has been needed so that the light source and the phosphor can be disposed to be separated from each other.

Figure 1:
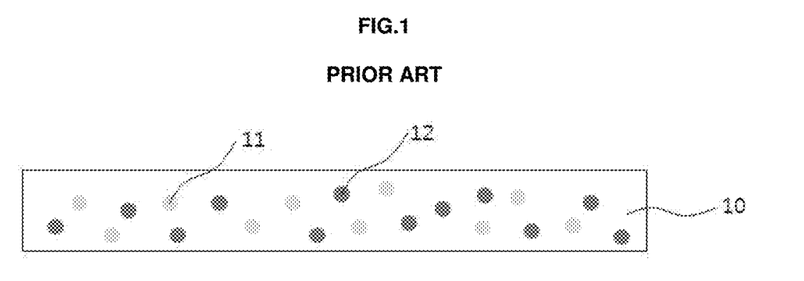
FIG. 1 is a cross-sectional view illustrating a conventional phosphor plate.
Figure 2:
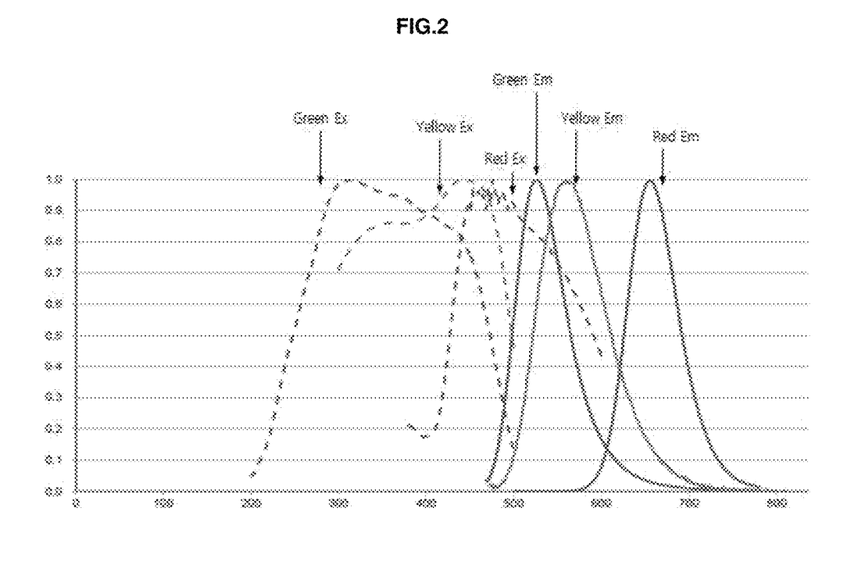
FIG. 2 is a graph showing wavelength areas according to each color of light.

In order to coat the phosphor, a separate base substrate is needed. This substrate simply serves as a support layer of a phosphor film and becomes a factor that causes an increase in material costs for a lighting member. Also, the substrate optically serves as an intermediate layer, thereby causing partial transmittance and light losses. As shown in FIG. 1, when producing a phosphor plate 10, two kinds of phosphors 11, 12 are used in a state of being mixed in order to set a temperature for a specific color. As can be seen from the graph of FIG. 2, absorption wavelengths and emission wavelengths of different kinds of phosphors overlap with each other, thereby causing a reduction of properties.

Also, when the phosphor is applied to lighting as a remote phosphor, a portion of the phosphor exposed to the outside of the lighting has a high possibility of being contaminated by moisture and dust of the outside. Furthermore, a fluorescent screen can be partially damaged due to scratches and the like, and this becomes a main factor of the reduction of optical efficiency. Even though the conventional phosphor may be applied to lighting showing a low output as an UV curing form, it has a limit in extending an application scope because a phosphor layer is easily damaged by heat when the phosphor is applied to lighting showing a high output.

Furthermore, a phosphor plate for an LED element is produced using glass powder (glass frit) and a phosphor. The phosphor plate has a composite structure in which a phosphor based on an inorganic crystal is dispersed in a glass matrix. When producing the phosphor plate by firing glass powder, a structural defect such as pores and the like is generated. Such a structural defect becomes a factor that causes a reduction of strength of the phosphor plate. The structural defect causes destruction or damage by physical damage generated during post processes such as a grinding process, a dicing process, a packaging process or the like and during driving the LED element for a long time.

BRIEF DESCRIPTION OF THE DRAWINGS

The embodiments will be described in detail with reference to the following drawings in which like reference numerals refer to like elements wherein.

(A) of FIG. 7 is a graph resulting from floating a firing temperature and a thickness of the ceramic phosphor plate according to the embodiment of the present disclosure and (B) of FIG. 7 is a surface graph showing a correlation of transmittance between the thickness and the firing temperature of the ceramic phosphor plate according to the embodiment of the present disclosure.

(A) of FIG. 8 is a graph resulting from floating optical efficiency regarding the firing temperature and thickness of the ceramic phosphor plate according to the embodiment of the present disclosure, and (B) of FIG. 8 is a surface graph showing a correlation of optical efficiency between the thickness and the firing temperature of the ceramic phosphor plate according to the embodiment of the present disclosure.

DETAILED DESCRIPTION

Hereinafter, the configurations and operations according to embodiments of the present disclosure will be described in detail with reference to the accompanying drawings. The present disclosure may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms.

These terms are only used for the purpose for distinguishing a constitutive element from other constitutive element.

Figure 3:
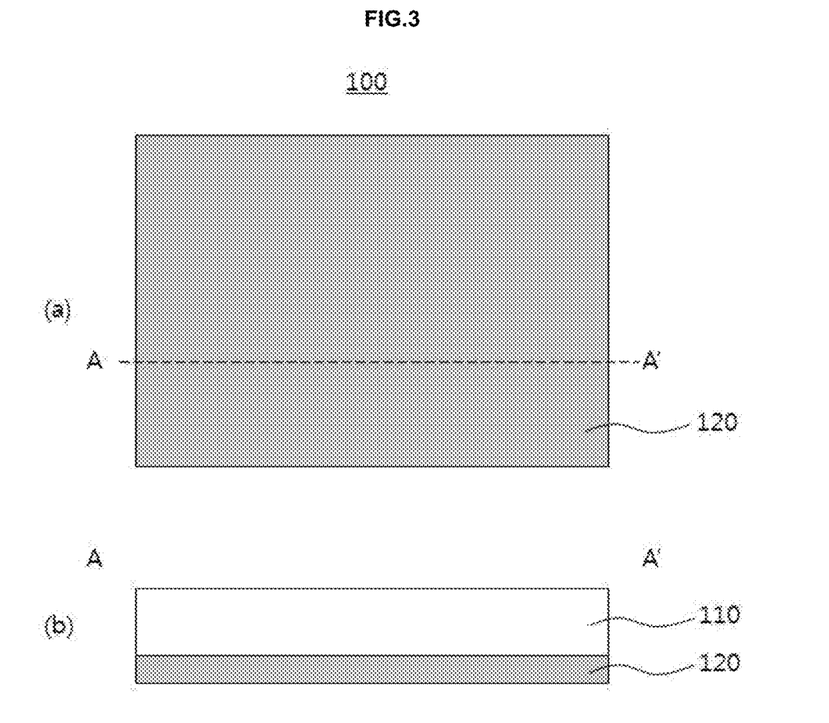
FIG. 3 is a plan view and a cross-sectional view of a ceramic phosphor plate according to an embodiment of the present disclosure.

FIG. 3 is a plan view and a cross-sectional view of a ceramic phosphor plate 100 according to the embodiment of the present disclosure.

Referring to FIG. 3, the ceramic phosphor plate 100 according to the present embodiment of the disclosure includes a first phosphor layer 110 and a second phosphor layer 120. The first phosphor layer 110 includes a phosphor of a short wavelength area in a transparent ceramic matrix. The phosphor of the short wavelength area may be an inorganic phosphor of a green or yellow area having a wavelength of 510 to 580 nm. A mixture of at least two kinds of phosphors within the wavelength range may be used as the phosphor of the short wavelength area. The first phosphor layer 110 is produced in a plate form through compressing and firing so as to replace a substrate in a conventional phosphor plate.

The inorganic phosphor is mixed in a powder form. The inorganic phosphor is mixed with ceramic powder that is a transparent ceramic matrix, and the mixture is sufficiently mixed and dispersed using a ball mill. With regard to the kind of the ceramic powder, based on a thickness of 100 μm, ceramic having a light transmittance of 40% or more may be used. For example, a transparent silicate-based ceramic and an aluminum oxide-based ceramic, which are appropriate as an optical material such as borate glass, phosphate glass or the like, may be used in the ceramic powder. The phosphor of the short wavelength area is contained in an amount of 1 to 10 wt % in the transparent ceramic matrix.

The mixture of the inorganic phosphor and glass powder is put into a SUS (Stainless Use Steel) mold and is subjected to uniaxial compression so as to have a plate or disc form. At this time, the compression is performed for 5 minutes at 7 ton. The compressed mixture of the inorganic phosphor and glass powder is put into a firing furnace, thereby performing firing. At this time, a temperature and time for performing firing may be adjusted according to a glass transition temperature Tg of the inorganic phosphor and the glass powder.

The fired phosphor plate (first phosphor layer 110) is subjected to surface polishing so that a thickness and a surface roughness of the fired phosphor plate can be adjusted so as to be matched with a property required by the present embodiment. At this time, the first phosphor layer 110 is ground to have a thickness of 200 to 1000 μm, and a surface roughness of 0.1 to 0.3 μm.

The second phosphor layer 120 is formed by coating one surface on the first phosphor layer 110 prepared in a plate form with a paste containing a phosphor of the long wavelength area. The phosphor of the long wavelength area may be an inorganic phosphor of a red area having a wavelength of 580 to 680 nm. A mixture in which at least two kinds of phosphors within the wavelength range are mixed may be used as the phosphor of the long wavelength area.

The phosphor paste is prepared by mixing the phosphor of the long wavelength area with ceramic powder and an ethyl cellulose-based organic vehicle. Glass powder may be used as the transparent ceramic powder, and appropriate transparent glass for an optical material such as borate glass, phosphate glass or the like may be used in the glass powder. The phosphor of the long wavelength may have a particle size of 1 to 20 μm, and the glass powder may have a particle size of 1 to 20 μm. When the particle size of the powdered glass is so small, agglomeration may be generated upon mixing the organic vehicle. On the contrary to this, when the particle size is so large, an amount of light passing through the phosphor than an amount of light excited in the phosphor is increased, so white light having a good property may not be obtained. Also, a mixture formed by mixing powder having a relatively large particle size and powder having a relatively small particle size may be used in the powdered glass. The transparent ceramic powder may be mixed in an amount of 35 to 50 wt %, and the organic vehicle may be added in an amount of 35 to 50 wt %. According to each desired optical property, the transparent ceramic powder and the organic vehicle may be added by adjusting a mixing rate with the phosphor.

When the particle size of the long-wavelength phosphor is less than 1 μm, agglomeration may be generated upon mixing the organic vehicle. On the contrary, when the particle size of the phosphor is more than 20 μm, a sufficient viscosity may not be obtained. Thus, it is difficult to obtain a pattern having a form required when printing the phosphor paste on the transparent substrate. Also, since a space between phosphor particles is increased, an amount of light passing through the phosphor than an amount of light excited in the phosphor may be increased. The long-wavelength phosphor may be contained in an amount of 15 to 30 wt %. An amount of the phosphor may range from 25 to 55% compared to the amount of the transparent ceramic powder. When the amount of the phosphor is less than 25%, an amount of the red phosphor is very reduced, so it is difficult to express red light. Furthermore, since the amount of the transparent ceramic powder is increased, total transmittance of the paste may be reduced. On the contrary, when the amount of the phosphor is more than 55%, the amount of the phosphor is very increased so that the phosphor cannot be sufficiently encapsulated in the transparent ceramic, thereby causing a physical scratch and a reduction of reliability at a high-temperature and humidity environment. The content of the phosphor may be adjusted according to the kind of the phosphor.

Also, a solid content rate of the phosphor and the transparent ceramic powder contained in the phosphor paste may be 1.5:1 to 1:1 compared to the content of the organic vehicle. When the solid content rate is less than 1, the viscosity of the phosphor paste is very reduced, so that the shape of a pattern can be distorted and cannot be completely maintained upon printing. On the contrary, when the solid content rate is more than 1.5, the viscosity of the phosphor paste is increased, a printing ability may be remarkably reduced.

The phosphor of the long-wavelength area, the transparent ceramic powder, and the organic vehicle are put into a paste mixer and are then mixed by performing revolution and rotation mixing at 100 to 1000 rpm for 1 to 30 minutes. Then, the mixture is put into a three-roll mill and is mixed again at 100 to 1000 rpm for 1 to 30 minutes. The first phosphor layer 110 is coated with the mixture, which has been mixed again, using a bar coating method, a screen coating method or the like, thereby forming the second phosphor layer 120. Then, the ceramic phosphor plate of the present embodiment in which the second phosphor layer 120 is formed on the first phosphor layer 110 is completed by drying or heat treatment. The heat treatment is intended to sinter the phosphor paste and to remove the organic vehicle. The heat treatment method is not largely limited. The heat treatment may be performed in a heat treating furnace or an oven.

Figure 4:
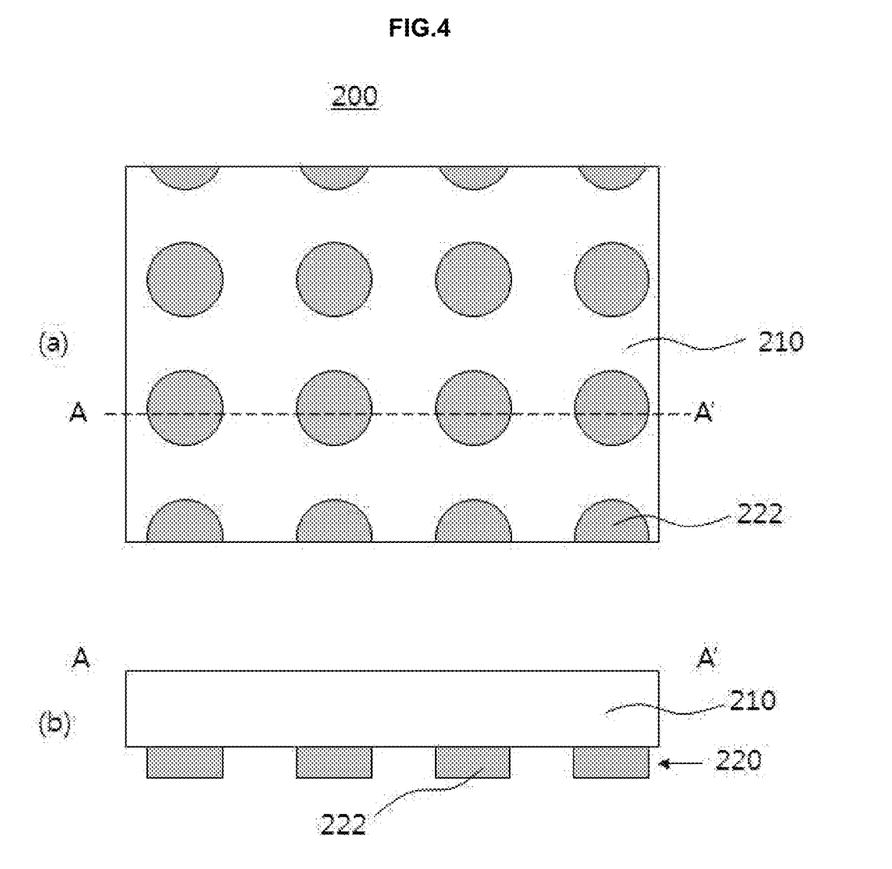
FIG. 4 is a plan view and a cross-sectional view of a patterned ceramic phosphor plate according to the embodiment of the present disclosure.

FIG. 4 is a plan view and a cross-sectional view of a patterned ceramic phosphor plate 200 according to the embodiment of the present disclosure Referring to FIG. 4, the ceramic phosphor plate 200 according to the present embodiment of the disclosure includes: a first phosphor layer 210 and a second phosphor layer 220 patterned on the first phosphor layer. The first phosphor layer 210 is produced in a plate form via compressing and firing so as to replace a substrate in the conventional phosphor plate. Since the method of forming the first phosphor layer 210 is identical to that previously described with reference to FIG. 3, the description thereof is omitted for avoiding overlapping. Also, since a phosphor paste including the phosphor of a long-wavelength area constituting the second phosphor layer 220 is identical to that previously described with reference to FIG. 3, the description thereof is omitted for avoiding overlapping.

Unlike the phosphor paste coated on the entire surface of the first phosphor layer (reference numeral 110 of FIG. 3) in FIG. 3, the phosphor paste is printed so as to form patterns 222. In FIG. 4, the pattern 222 is illustrated as a circular pattern, but is not limited thereto. In addition to the circular shape, patterns having various shapes such as a rectangular shape, a square shape, a hexagonal shape, a triangular shape and the like according to each desired property of the phosphor plate may be printed. A size of the pattern 222 may be adjusted according to a color coordinate and a color rendering index (CRI) intended to be implemented. The pattern 222 may have an area of 500 μm2 to 106 μm2 regardless of a shape of the pattern. The pattern 222 may be formed by adjusting the number of the patterns and a separation distance between the pattern and the adjacent pattern such that a total area of the pattern 222 ranges from 20 to 100% compared to an area of the first phosphor layer 210. As an area rate of the first phosphor layer 210 and the second phosphor layer 220 is gradually increased, namely, the area or the number of the pattern 220 is gradually increased, warm white light can be more easily implemented. The properties such as a color temperature and the like will be described in detail later.

The pattern 222 may be formed using a method of simultaneously performing patterning and coating such as a screen printing method, a gravure coating method and the like. When the screen printing method is used, the number of the patterns may be easily adjusted by adjusting the number of screen meshes, but it is relatively difficult to adjust a separation distance between the patterns due to a shape of the pattern. On the contrary, when the gravure coating method is used, desired patterns are formed in a copper plate, thereby facilitating patterning, but an additional cost for production of the copper plate is needed. Accordingly, an appropriate printing method according to each desired property of lighting may be used.

Figure 5:
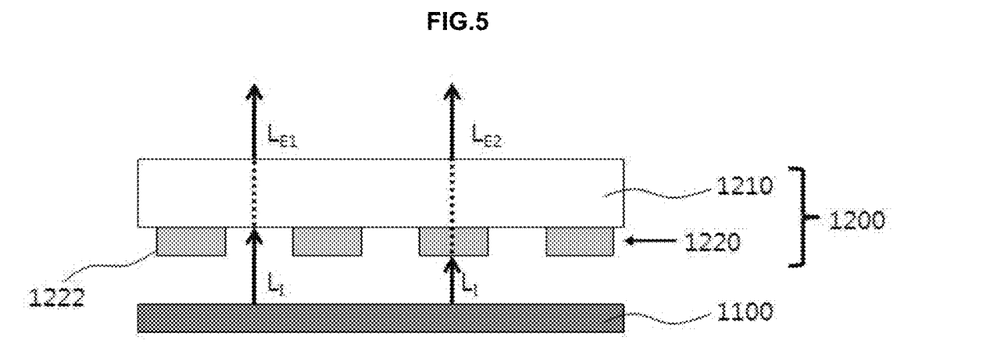
FIG. 5 is a schematic diagram schematically illustrating a case in which light irradiated from a light source is excited while passing through the ceramic phosphor plate according to the embodiment of the present disclosure.

FIG. 5 is a schematic diagram schematically illustrating a case in which light irradiated from a light source 1100 is excited while passing through a ceramic phosphor plate 1200 according to the embodiment of the present disclosure;

Referring to FIG. 5, a lighting device according to a further aspect of the present embodiment includes the ceramic phosphor plate 1200 having a short-wave phosphor layer 1210 and a long-wave phosphor layer 1220. The short-wave phosphor layer 1210 includes an inorganic phosphor having a wavelength of 510 to 580 nm, and the long-wave phosphor layer 1220 includes an inorganic phosphor having a wavelength of 580 to 680 nm. A light incoming part 1100 is disposed at a place which is near to the long-wave phosphor layer 1220.

Also, a transparent ceramic matrix constituting the short-wave phosphor layer 1210, has the same refractive index as that of a matrix constituting the long-wave phosphor layer 1220, or even through there is a difference between the refractive indexes, the matrix constituting the long-wave phosphor layer 1220 may be made of a material having a higher refractive index than that of the matrix constituting the short-wave phosphor layer. Since the materials and the configurations of the short-wave phosphor layer 1210 and the long-wave phosphor layer 1220 have been previously explained, the description thereof is omitted for avoiding overlapping.

The light incoming part 1100 may emit the light of a blue wavelength area. When incident light LI emitted from the light incoming part 1100 is irradiated to the ceramic phosphor plate 1200, the kind of wavelengths of each excited light LE1, LE2 is changed according to each area of the ceramic phosphor plate 1200. That is, when the incident light LI is irradiated to a portion to which the short-wave phosphor layer 1210 is exposed, the light is excited from the short-wave phosphor. However, when the incident light LI passes through the transparent ceramic matrix of the short-wave phosphor layer 1210, the excited light LE1 is transmitted as the light of a blue wavelength area. On the contrary, when the incident light LI is irradiated to an area in which patterns of the long-wave phosphor layer 1220 are present, the excited light LE2 is excited as the light of a red wavelength area.

Accordingly, a color temperature of the excited light is changed according to the rate of a total area of the pattern 1222 of the long-wave phosphor layer 1220 to an area of the short-wave phosphor layer 1210. That is, when the rate of the total area of the pattern 1220 of the long-wave phosphor layer 1220 to the area of the short-wave phosphor layer 1210 is 20 to 35%, a rate of the light of a blue, yellow or green wavelength area is increased, so that white light having a cool white color and a color temperature of 4000 to 6000K can be implemented. On the contrary, when the rate of the total area of the pattern 1220 of the long-wave phosphor layer 1220 to the area of the short-wave phosphor layer 1210 is more than 35%, a rate of the light of a red wavelength area is increased, so that white light having a warm white color and a color temperature of 4000 to 6000K can be implemented.

Figure 6:
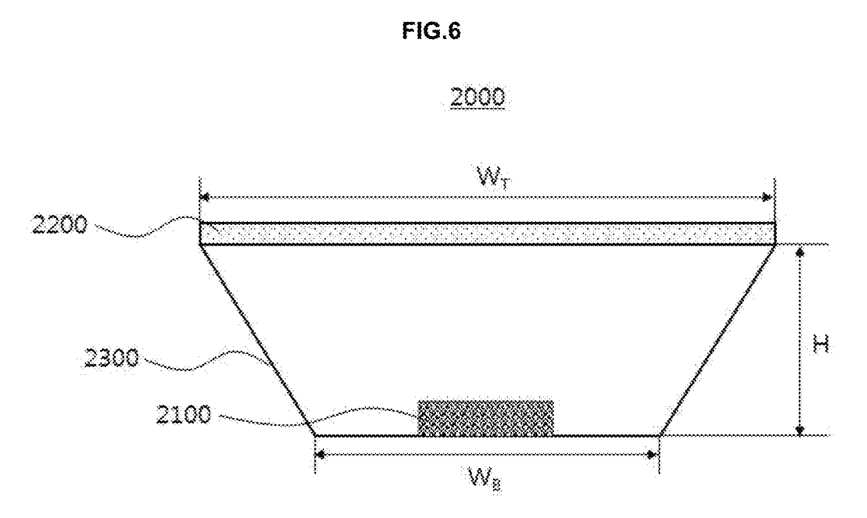
FIG. 6 is a cross-sectional view illustrating a schematic structure of a lighting device according to the embodiment of the present disclosure.

FIG. 6 is a cross-sectional view illustrating a schematic structure of a lighting device 2000 according to the embodiment of the present disclosure.

Referring to FIG. 6, the lighting device 2000 according to the present embodiment of the disclosure includes a ceramic phosphor plate 2200 as described above. The ceramic phosphor plate 2200 is provided to be separated from a light source 2100. A distance separated from the light source may be 10 to 20 mm. The separation distance may be preferably, 12 to 18 mm. When the separation distance is more than 20 mm, light extraction may not be sufficiently performed. On the contrary, the separation distance is less than 10 mm, the ceramic phosphor plate 2200 may cause thermal distortion due to heat generated from the light source 2100.

The lighting device includes a housing 2300 configured to be gradually increased from a bottom surface to a top surface with the light source 2100 based on the light source 2100. The light source 2100 is an optical element for emitting light, and as one example, a solid light emitting element may be applied as the light source. Any one selected from among an LED (Light emitting Diode), an OLED (Organic Light Emitting Diode), an LD (laser diode), a laser, and a VCSEL (Vertical Cavity Surface Emitting Laser) may be applied as the solid light emitting element. The ceramic phosphor plate 2200 is provided at an upper end of the housing 2300 and is disposed to be separated from the light source 2100. As previously described, the ceramic phosphor plate 2200 includes a matrix composed of a glass frit and a ceramic phosphor dispersed in the matrix. The inside of the housing may be filled with a material having a refractive index that is higher than or the same as that of the ceramic phosphor plate 2200.

Also, optical properties may be measured by an integrating sphere in such a form. The integrating sphere has internal luminance that is regular at any angle, and captures light reflected from a sample surface so that the light can be distributed to a surface of the integrating sphere with uniform roughness. A special paint, polytetrafluoroethylene (PTFE) or the like may be used as a coating material of an internal wall of the integrating sphere. The inside of the integrating sphere should not be contaminated. In the case of spectral transmittance, the rate of transmitted light without a sample is 100%, and the rate of light completely blocked by an opaque object such as an iron plate or the like is 0%. When one of transmission colors has a large dispersion effect in a transmission material, it is preferable to measure the property using the integrating sphere.

The integrating sphere is prepared in a size showing a WT of 55 to 60 mm, a WB of 35 to 40 mm and an H of 15 to 20 mm. First, in a state where the ceramic phosphor plate 2200 is not present, the radiant flux of a blue LED, which is the light source 2100, is measured. Then, the ceramic phosphor plate 2200 is mounted, and a luminous flux (lumens) is measured. Thus, when the luminous flux is divided by the radiant flux of the blue LED previously measured, the value of optical efficiency may be obtained.

Figure 7:
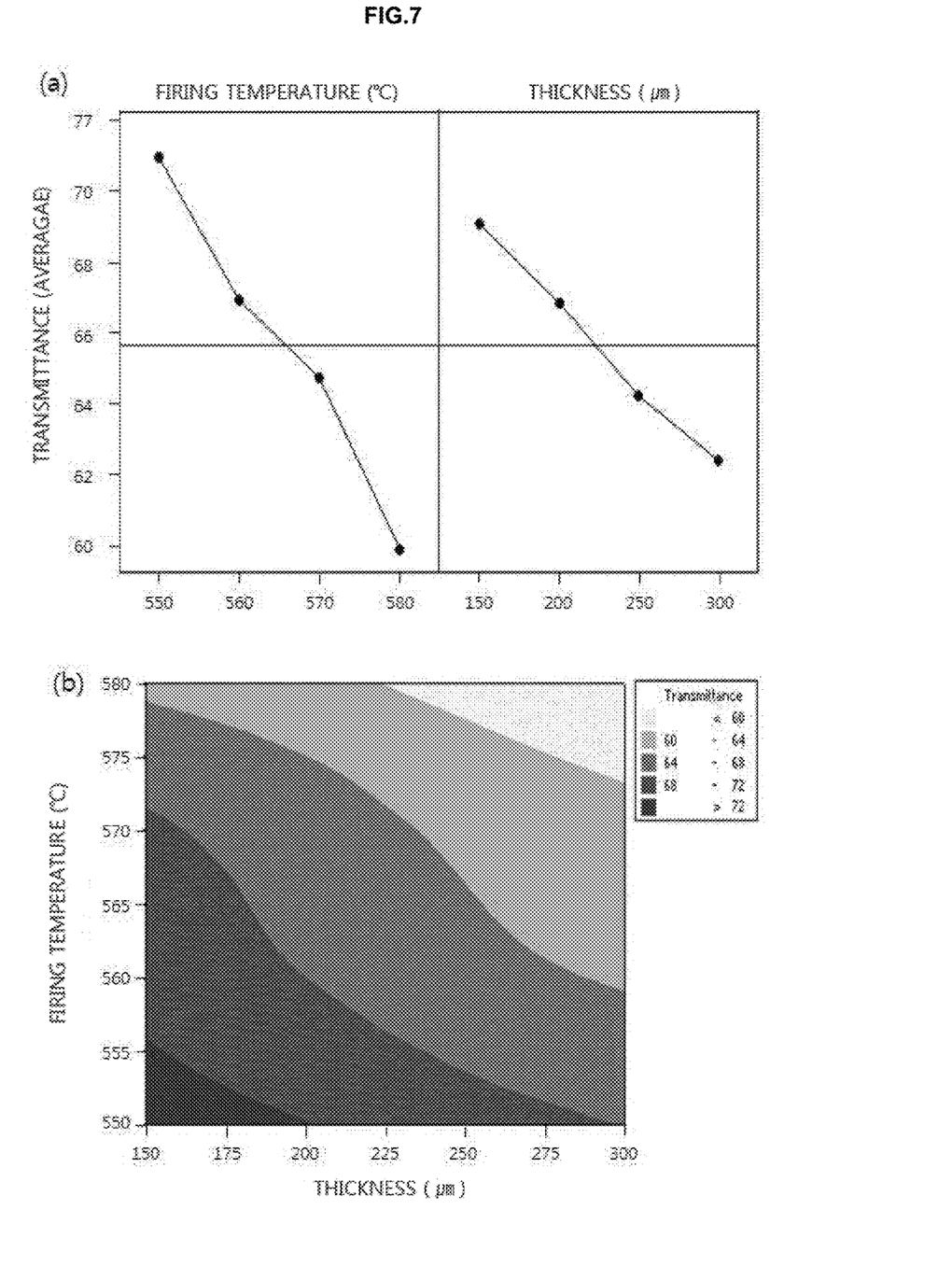

(A) of FIG. 7 is a graph resulting from floating a firing temperature and a thickness of the ceramic phosphor plate according to the embodiment of the present disclosure. (B) of FIG. 7 is a surface graph showing a correlation of transmittance between the thickness and the firing temperature of the ceramic phosphor plate according to the embodiment of the present disclosure.

Figure 8:
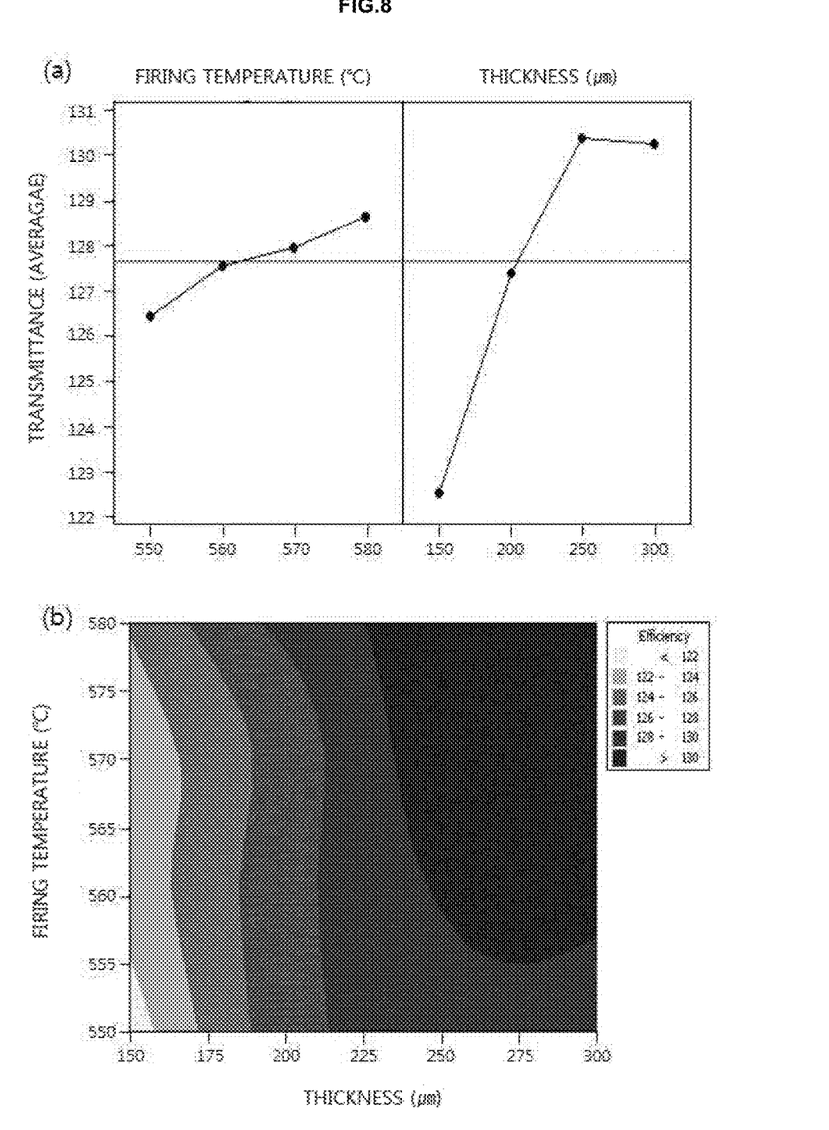

(A) of FIG. 8 is a graph resulting from floating optical efficiency regarding the firing temperature and thickness of the ceramic phosphor plate according to the embodiment of the present disclosure, and (B) of FIG. 8 is a surface graph showing a correlation of optical efficiency between the thickness and the firing temperature of the ceramic phosphor plate according to the embodiment of the present disclosure.

Referring to FIGS. 7 and 8, it can be seen that transmittance is reduced according to each thickness and firing temperature of the ceramic phosphor plate, but optical efficiency is increased. Accordingly, in order to maintain high transmittance without a reduction of optical efficiency, there is a need to adjust the thickness and the firing temperature. However, since there is a limit in physically adjusting the thickness, the long-wave phosphor layer is patterned as described above so as to have a thickness showing high optical efficiency without a reduction of the optical efficiency and to enable adjustment of the size and number of a pattern for preventing a reduction of transmittance.

Hereinafter, the present disclosure will be described in greater detail based on examples. The present disclosure may, however, be embodied in different forms and should not be construed as limited to the examples described for the purpose for understanding of the present disclosure.

EXAMPLES

Examples 1 to 3

A PiG (Phosphor in Glass Matrix) matrix was prepared in a circular plate form having a thickness of 0.5 mm and a diameter of 60 mm by including an LuAg phosphor (green) having a light-emitting wavelength of 550 nm. 20 wt % of a nitride phosphor (red) having a light-emitting wavelength of 620 nm, 40 wt % of a glass powder, and 60 wt % of an ethyl cellulose were mixed to prepare a red phosphor paste, and the circular plate was coated with the red phosphor paste using a silk screen method. Pattern conditions and property measurement results are shown in Table 1.

Comparative Example 1

A PiG matrix was prepared in a circular plate form having a thickness of 0.5 mm and a diameter of 60 mm by including an LuAG phosphor having a light-emitting wavelength of 550 nm and a nitride phosphor having a light-emitting wavelength of 620 nm. Production conditions and property measurement results are shown in Table 1.

TABLE 1

|  | Comparative Example 1 | Example 1 | Example 2 | Example 3 |
|---|---|---|---|---|
| Coating area of the red phosphor paste | — | 100% | 35% | 20% |
| Demand quantity of the red phosphor (g) | 2.4 | 0.026 | 0.022 | 0.01 |
| Luminous flux (lumens) | 431.5 | 340.5 | 418.9 | 473.5 |
| Color coordinate Cx | 0.4464 | 0.4974 | 0.433 | 0.38 |
| Color coordinate Cy | 0.4242 | 0.38 | 0.3873 | 0.3873 |
| Color temperature CCT(K) | 3003.4 | 2038.2 | 2924.6 | 4084.1 |
| Optical efficiency (lm/Wrad.blue) | 150 | 131 | 161.1 | 182.1 |
| Color rendering index CRI | | 74.6 | 79.7 | 84.7 |
| R9 | | −12.6 | 12.6 | 25.4 |

Figure 9:
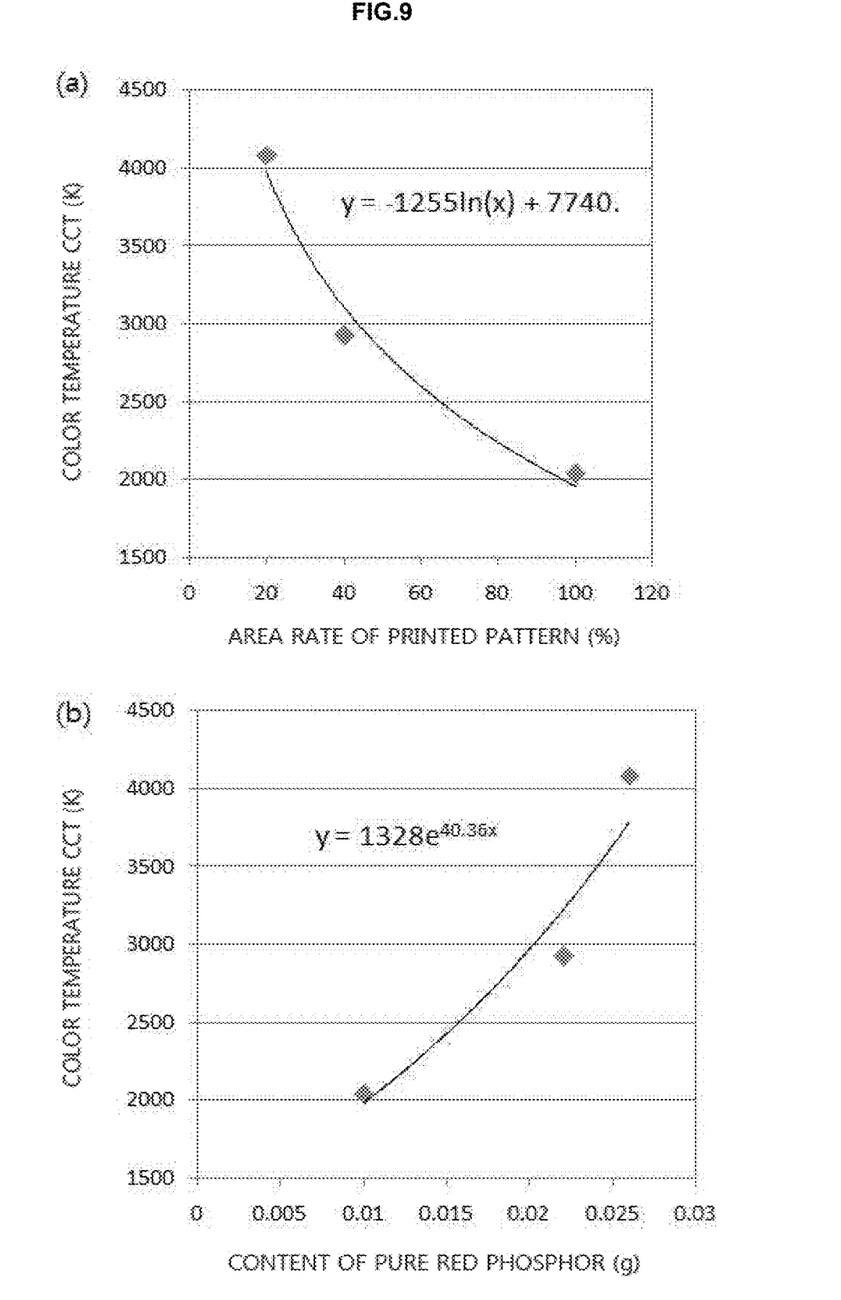
FIG. 9 is a graph showing a correlation between a pattern area rate and a color temperature CCT and a correlation between a content of a red phosphor and a color temperature CCT.

As shown in Table 1 above, unlike the ceramic phosphor plate of Comparative Example 1 in which both the red phosphor and the green phosphor are included in the PiG matrix, in the ceramic phosphor plate according to the present example, the demand quantity of the high-priced red phosphor could be reduced up to about 1/100 to 1/250. Also, physical properties such as the color rendering index, optical efficiency, luminous flux and the like were similarly or highly maintained with various changes of the color temperature. Based on this result, a correlation between a pattern area rate and the color temperature CCT and a correlation between a content of the red phosphor and the color temperature CCT are illustrated in FIG. 9. According to FIG. 9, the color temperature required according each lighting device could be easily adjusted by the printing area of the pattern or the content of the red phosphor.

Examples 4 to 7: LuAG-Based Phosphor

A PiG (Phosphor in Glass Matrix) matrix was prepared in a circular plate form having a thickness of 0.5 mm and a diameter of 60 mm by including 7 wt % of an LuAg phosphor (green) having a light-emitting wavelength of 550 nm. 20 wt % of a nitride phosphor (red) having a light-emitting wavelength of 620 and 630 nm, 40 wt % of a glass powder, and 60 wt % of an ethyl cellulose were mixed to prepare a red phosphor paste, and the circular plate was coated with the red phosphor paste using a silk screen method. Pattern conditions and property measurement results are shown in Table 2.

Comparative Example 2

A PiG matrix was prepared in a circular plate form having a thickness of 0.5 mm and a diameter of 60 mm by including an LuAG phosphor having a light-emitting wavelength of 550 nm and a nitride phosphor having a light-emitting wavelength of 620 nm. Production conditions and property measurement results are shown in Table 1.

Comparative Example 3

A PiG matrix was prepared in a two-layered circular plate form having a thickness of 0.5 mm and a diameter of 60 mm by including an LuAG phosphor having a light-emitting wavelength of 550 nm and a nitride phosphor having a light-emitting wavelength of 620 nm. Production conditions and property measurement results are shown in Table 1.

ceramic phosphor plate according to the present example has excellent properties with small consumption of the red phosphor compared to the ceramic phosphor plate according to the PiG method (Comparative Example 2) showing pattern application in which two kinds of phosphors are included in a single layer or the method (Comparative Example 3) including each phosphor into the two-layered plate. Also, when the red phosphor has a wavelength of 630 nm, the demand quantity of the red phosphor could be reduced.

Examples 8 to 10: Nitride-Based Phosphor

A PiG (Phosphor in Glass Matrix) matrix was prepared in a circular plate form having a thickness of 0.5 mm and a diameter of 60 mm by including a nitride phosphor (green) having a light-emitting wavelength of 550 nm. 20 wt % of a nitride phosphor (red) having a light-emitting wavelength of 620 and 630 nm, 40 wt % of a glass powder, and 60 wt % of an ethyl cellulose were mixed to prepare a red phosphor paste, and the circular plate was coated with the red phosphor paste using a silk screen method. Pattern conditions and property measurement results are shown in Table 3.

Comparative Example 4

A PiG matrix was prepared in a circular plate form having a thickness of 1 mm and a diameter of 60 mm by including a nitride phosphor having a light-emitting wavelength of 550 nm and a nitride phosphor having a light-emitting wavelength of 620 nm. Production conditions and property measurement results are shown in Table 3.

Comparative Example 5

A PiG matrix was prepared in a circular plate form having a thickness of 0.5 mm and a diameter of 60 mm by including a nitride phosphor having a light-emitting wavelength of 550 nm and a nitride phosphor having a light-emitting wave-

TABLE 2

|  | Comparative Example 2 | Comparative Example 3 | Example 4 | Example 5 | Example 6 | Example 7 |
|---|---|---|---|---|---|---|
| Upper layer | 550 nm (7 wt %) + 620 nm (2.4 wt %) | LuAG 550 nm 7 wt % | LuAG, 550 nm, 7 wt % | | | |
| Lower layer |  | Nitride 620 nm 7 wt % | Paste 620 nm, 20 wt % of phosphor | | Paste 630 nm, 20 wt % of phosphor | |
| Paste coating amount (g) | — | — | 0.09 | 0.11 | 0.09 | 0.11 |
| Demand quantity of the red phosphor (g) | 0.36 | 0.24 | 0.018 | 0.022 | 0.018 | 0.022 |
| Luminous flux (lumens) | 454.4 | 277.2 | 485.7 | 402.1 | 432.5 | 348.1 |
| Color coordinate Cx | 0.4397 | 0.4011 | 0.3863 | 0.454 | 0.4356 | 0.5052 |
| Cy | 0.4018 | 0.3428 | 0.388 | 0.3857 | 0.3846 | 0.3742 |
| Color temperature CCT(K) | 2933.7 | 3140.6 | 3926.6 | 2707.8 | 2855.9 | 1929.6 |
| Optical efficiency (lm/Wrad) | 167.1 | 101.92 | 179.9 | 148.9 | 160.2 | 128.9 |
| Color rendering index | 76.4 | 85.6 | 78.8 | 79.5 | 84.7 | 78 |

As shown in Table 2 above, when performing evaluation on an LuAG-based yellow phosphor, it could be seen that the length of 620 nm. Production conditions and property measurement results are shown in Table 3.

TABLE 3

| | Comparative Example 4 | Example 8 | Example 9 | Comparative Example 5 | Example 10 |
|---|---|---|---|---|---|
| Upper layer | Nitride 550 nm 1.2 wt % Nitride 620 nm 0.8 wt % | Nitride 550 nm 3 wt % | Nitride 550 nm 3 wt % | Nitride 550 nm 1.2 wt % Nitride 620 nm 0.8 wt % | Nitride 550 nm 3 wt % |
| Lower layer | | 620 nm Phosphor paste | 630 nm Phosphor paste | | 620 nm Phosphor paste |
| Paste Coating amount (g) | — | 0.07 | 0.09 | — | 0.08 |
| Demand quantity of the red phosphor (g) | 0.12 | 0.014 | 0.018 | 0.014 | 0.016 |
| Luminous flux (lumens) | 349 | 370.70 | 359.23 | 393 | 398.70 |
| Color coordinate Cx | 0.4378 | 0.4722 | 0.4602 | 0.4393 | 0.4419 |
| Cy | 0.4073 | 0.4788 | 0.4798 | 0.4087 | 0.4138 |
| Color temperature CCT(K) | 3045.9 | 3010.9 | 3178.4 | 2996 | 2993.6 |
| Efficiency (lm/Wrad) | 112 | 123.73 | 119.9 | 128 | 146.0 |
| Color rendering index | 74.7 | 74.9 | 77.7 | 76.7 | 79.1 |

As shown in FIG. 3, when performing evaluation based on a nitride-based yellow phosphor, it could be confirmed that the same effect as that generated from the LuAg-based yellow phosphor is implemented. However, it could be confirmed that even though the thickness is increased up to two times from 500 μm to 1000 μm, an increase amount of the red phosphor is not large.

An Example of another composition for implementing the ceramic phosphor plate will be hereinafter described with reference to FIGS. 10 to 12. The composition exemplified in the present example may be applied to each ceramic phosphor plate previously explained based on Examples 1 to 10.

A phosphor-transparent ceramic composite composition according to the present example contains: transparent ceramic powder; at least one powdered inorganic phosphor; at least one silicate; and a binder compound cross-linked by heat treatment.

In the phosphor-transparent ceramic composite composition according to the present example, the transparent ceramic powder serves as a matrix in which the inorganic phosphor is dispersed. The transparent ceramic powder enables protection of the phosphor from a physical or chemical impact by encapsulating the inorganic phosphor. The transparent ceramic powder may be a silicate-based glass powder such as sodium borosilicate, aluminosilicate, zinc borosilicate, barium zinc silicate, or a mixture thereof. The glass powder may be appropriately used as an optical material. The transparent ceramic powder may have an average particle size D50 of 1 to 50 μm. When the average particle size D50 of the transparent ceramic powder is less than 1 μm, the phosphor may not be sufficiently encapsulated by the transparent ceramic powder, or the powder may be agglomerated not to be sufficiently dispersed. On the contrary, when the average particle size D50 is more than 50 μm, an amount of light passing through the phosphor than an amount of light excited in the phosphor is increased, so white light having good properties cannot be obtained. Also, a mixture of powder having a relatively large average particle size and powder having a relatively small average particle size may be used as the transparent ceramic powder. It is preferable to select transparent ceramic powder having appropriate particle-size distribution in consideration of the average particle size of the phosphor powder.

A yttrium aluminum garnet (YAG), lutetium aluminum garnet (LuAG), nitride, silicate, or sulfide-based inorganic phosphor powder may be used as the inorganic phosphor powder. According to each desired property of light, one kind or two kinds of phosphors may be used in a state of being mixed. The inorganic phosphor powder may be contained in an amount of 5 to 30 parts by weight with respect to 100 parts by weight of the transparent ceramic powder. When the amount of the inorganic phosphor is less than 5 parts by weight, an amount of transmitted light than an amount of excited light is increased. On the contrary, when the amount of the inorganic phosphor is more than 30 parts by weight, the inorganic phosphor may not be sufficiently encapsulated by the transparent ceramic powder, and an increase in costs may be caused. Also, according to each thickness of the phosphor plate, the content of the inorganic phosphor is adjusted. When the thickness of the phosphor plate is reduced, the content of the inorganic phosphor should be increased. For example, when the thickness of the phosphor plate is 120 μm, the content of the inorganic phosphor is increased up to about 1.5 times of the content of the inorganic phosphor when the thickness of the phosphor plate is 200 μm. The average particle size D50 of the inorganic phosphor powder may range from 5 to 25 μm. When the average particle size of the inorganic phosphor powder is selected, it may by selected in consideration of an average particle size of the transparent ceramic powder.

The binder compound functions to improve strength of the mixture of the transparent ceramic powder and the phosphor powder. A material having at least one silicate ($SiO_2$) in a molecule may be used as the binder compound. Furthermore, a material, which does not have an effect on optical properties of the phosphor plate and a lighting device, may be used as the binder compound. Even through it will be described in detail later, when the phosphor-transparent ceramic composite composition is subjected to heat treatment, the silicate is cross-linked with that of the transparent ceramic powder. Accordingly, the formation of pores, which may be generated after the heat treatment of the phosphor-transparent ceramic composite composition, is prevented so that strength of the phosphor plate can be improved. Tetraethyl orthosilicate (TEOS), tetramethyl orthosilicate, tetrapropyl orthosilicate, tetraisopropyl orthosilicate or a mixture thereof may be used as the binder compound. The binder compound is contained in an amount of 0.2 to 5 parts by weight with respect to 100 parts by weight of the transparent ceramic powder. When the amount of the binder compound is less than 0.2 parts by weight, an amount of the cross-linked silicate is not sufficient, so that pores may be generated in the phosphor plate. On the contrary, when the amount of the binder compound is more than 5 parts by weight, impurities such as an excessive organic compound may remain in a state of being not removed after the heat treatment. The phosphor-transparent ceramic composite composition explained through the embodiment may be applied to the first phosphor layer or the second phosphor layer of each ceramic phosphor plate according to Examples 1 to 10. In such a case, physical hardness of the phosphor plate can be increased.

A phosphor-transparent ceramic composite plate according to another aspect of the present example is formed by firing the phosphor-transparent ceramic composite composition including at least one powdered inorganic phosphor dispersed in the transparent ceramic powder and a cross-linking agent being cross-linked by heat treatment in at least two steps. Since the description of the phosphor-transparent ceramic composite composition has been previously performed, the description is omitted for avoiding overlapping.

The phosphor-transparent ceramic composite composition is put into a ball mill device and is then sufficiently pulverized and mixed at 130 to 150 rpm for 10 to 30 hours at room temperature. The pulverized and mixed phosphor-transparent ceramic composite composition is subjected to uniaxial compression to have a plate or disc form in a state of being put into a SUS (Stainless Use Steel) mold. At this time, the compression is performed at the pressure of 1 to 10 ton for 1 to 10 minutes. The mold may have a circular form having a thickness of 100 to 300 µm, and a diameter of 50 to 100 mm. The phosphor-transparent ceramic composite composition molded in the plate form is subjected to heat treatment through at least two steps. This phosphor-transparent ceramic composite composition may be also applied to the first phosphor layer or the second phosphor layer of each ceramic phosphor plate according to Examples 1 to 10.

Figure 10:
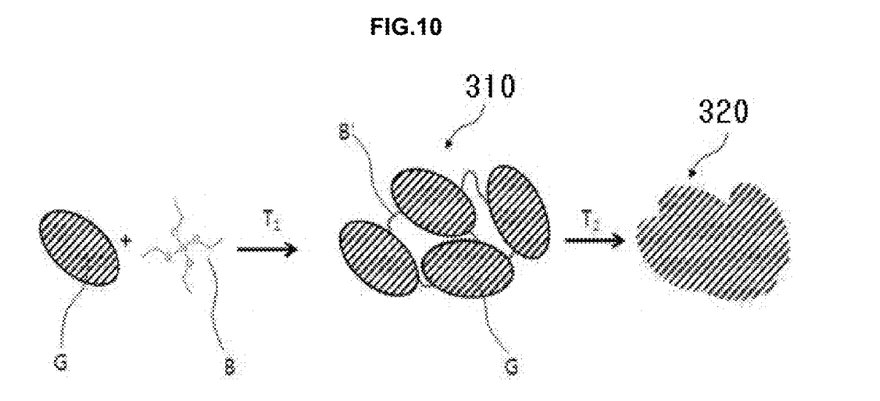
FIG. 10 is a schematic diagram showing a physical change according to heat treatment of the phosphor-transparent ceramic composite according to the embodiment of the present disclosure.

FIG. 10 is a schematic diagram showing a physical change according to heat treatment of the phosphor-transparent ceramic composite composition according to the embodiment of the present disclosure.

When the phosphor-transparent ceramic composite composition is subjected to primary heat treatment T1 for 10 to 60 minutes at the temperature of 200 to 300° C., the binder compound B is hydrolyzed to form the transparent ceramic powder G and a cross link B', thereby creating a composite 310 after primary firing. That is, the binder compound B is hydrolyzed upon the primary heat treatment T1 so that a carbon compound group can be separated, and the remaining silicate can be cross-linked with that of the transparent ceramic powder G. However, the phosphor plate in the step of the primary heat treatment T1 has many pores among the composites 310 as shown in FIG. 10. In order to remove the pores and to improve strength of the phosphor plate, secondary heat treatment T2 is performed.

A temperature of the secondary heat treatment T2 is changed according to each temperature resulting from the kind of the transparent ceramic and the binder compound B. The heat treatment temperature is changed according to each glass transition temperature Tg of the transparent ceramic and the binder compound B. At this time, when the temperature is very high, it may have a bad effect on the phosphor, and accordingly, the heat treatment is performed for 10 to 60 minutes at the temperature of 600 to 650° C. The primarily fired composite 310 heated at a temperature beyond each glass transition temperature Tg of the transparent ceramic and the binder compound B is melted and thus becomes a molded body 320 having a porosity reduced up to less than 1% after secondary firing. Since the phosphor-transparent ceramic composite plate according to the present embodiment is composed of the inorganic compound, a defect such as pores and the like has a large effect on strength and hardness of the molded body. Accordingly, the defect is sufficiently removed during the secondary heat treatment T2.

In order to adjust a surface roughness of the phosphor-transparent ceramic composite plate according to the present embodiment, a surface polishing process is performed after the secondary heat treatment. The more a surface roughness of the phosphor-transparent ceramic composite plate is reduced, the more light irradiated from the light source is uniformly incident to the phosphor-transparent ceramic composite plate, thereby enabling the improvement of optical properties. At this time, a grinding process is performed so that the phosphor-transparent ceramic composite plate can have a surface roughness of 0.2 µm or less.

The phosphor-transparent ceramic composite plate produced as described above is subjected to a dicing process, a drilling process and a packaging process so as to be used in a lighting device. The post processes including a grinding process cause physical damage to the phosphor-transparent ceramic composite plate. Also, when an LED element is driven, under an operation environment (150° C.) and a reflow environment (250° C.), a stress of several N/mm$^2$ (MPa) is applied to the phosphor-transparent ceramic composite plate. Since the phosphor-transparent ceramic composite plate according to the present embodiment has a curvature strength of 100 N/mm$^2$ or more, the phosphor-transparent ceramic composite plate can have small damage even upon a process causing physical impacts, such as the grinding process, dicing process, drilling process, packaging process and the like.

The curvature strength may be calculated by the following formula.

$$\text{Curvature Strength }(\sigma) = \frac{3 \times L \times F}{2 \times b \times d^2} \quad \text{[Formula 1]}$$

Here, L represents a whole length (mm) of the phosphor-transparent ceramic composite plate, F represents a maximum load, b represents an effective width (mm) of the phosphor-transparent ceramic composite plate, and d represents a thickness of the phosphor-transparent ceramic composite plate.

Hereinafter, the present disclosure will be described in greater detail based on examples. The present disclosure may, however, be embodied in different forms and should not be construed as limited to the examples described for the purpose for understanding of the present disclosure.

Example 11

In order to implement a color temperature of 6000K, 15 g of an LuAG:Ce (Cerium doped lutetium aluminum garnet)-based phosphor having a wavelength of 550 nm, 1.5 g of a nitride-based phosphor (α-SiAlON) having a wavelength 595 nm, and 73.5 g of a zinc borosilicate glass powder were mixed, and 10 g of a tetraethyl orthosilicate (TEOS) was added to the mixture. Then, the composition was pulverized and mixed at 136 rpm for 24 hours using a ball mill device.

The composition was put into a SUS mold and was subjected to uniaxial compression at the pressure of 7 ton for 5 minutes so as to be molded in a phosphor plate form having a thickness of 500 μm and a diameter of 60 mm. The molded green body was put into a firing finance and was subjected to primary heat for 30 minutes at the temperature of 250° C. Then, firing was performed for 30 minutes at the temperature of 640° C. The fired phosphor plate was subjected to surface polishing to have a surface roughness of 0.2 μm.

The phosphor plate was processed in a size of 15 mm×200 mm and a thickness of 200 μm, and thus a curvature strength thereof was measured using a micro-autoradiography. The results thereof are shown in Table 1. Also, after cutting a cross section of the phosphor plate, a surface thereof was observed using an SEM (scanning electron microscope) ((A) of FIG. 3).

Comparative Example 6

Other conditions are the same as those of Example 1. By producing a phosphor plate to which no TEOS is added, a curvature strength thereof was measured using a micro-autoradiography. The results thereof are shown in Table 1. Also, after cutting a cross section of the phosphor plate, a surface thereof was observed using an SEM (scanning electron microscope) ((B) of FIG. 3).

TABLE 4

| | Actual Measurement Value | | Test Result | | Calculation Result |
|---|---|---|---|---|---|
| | Thickness (mm) | Width (mm) | Maximum Load (N) | Displacement (mm) | Curvature Strength (N/mm$^2$) |
| Example 11 | 0.17 | 11.91 | 2.04 | 0.43 | 131.49 |
| Comparative Example 6 | 0.16 | 14.27 | 1.26 | 0.34 | 79.33 |

Figure 12:
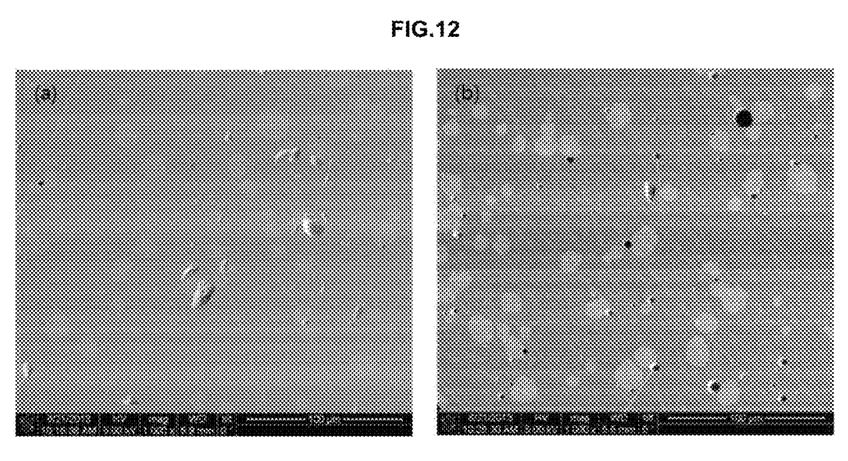

As shown in Table 4 and FIG. 12, it could be confirmed that a curvature strength of the phosphor plate produced in the present example is increased up to 40% or more. In terms of porosity and a surface scratch, a large difference ((A) of FIG. 12 shows the phosphor plate produced in Example 11 and (B) of FIG. 12 shows the phosphor plate produced in Comparative Example 6) was generated.

An application example in which a lighting device having a different structure is implemented using the phosphor-transparent ceramic composite composition previously described with reference to FIG. 10 will be hereinafter described with reference to FIG. 11.

Figure 11:
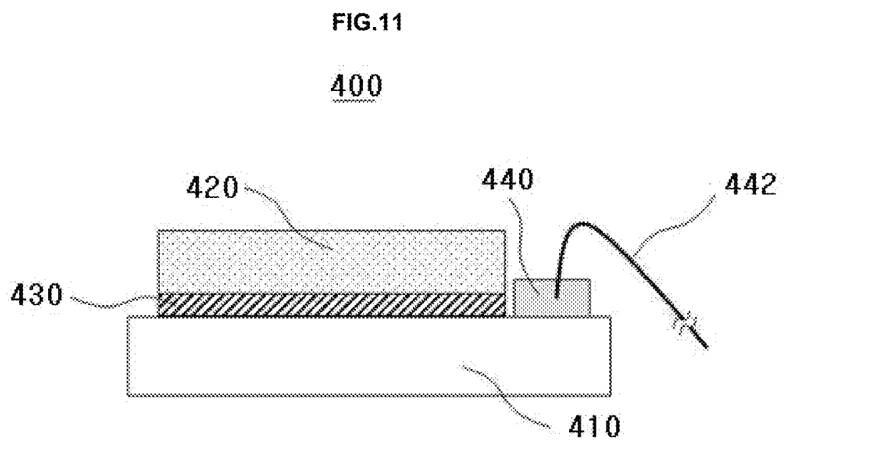
FIG. 11 is a schematic cross-sectional view of a lighting device including the phosphor-transparent ceramic composite plate according to the embodiment of the present disclosure; and (A) of FIG. 12 is an SEM (Scanning Electron Microscope) photo showing a cross section captured for confirmation of a porosity of the phosphor-transparent ceramic composite plate according to the embodiment of the present disclosure, and (B) of FIG. 12 is an SEM (Scanning Electron Microscope) photo showing a cross section of a phosphor-transparent ceramic composite plate of a comparative example.

FIG. 11 is a schematic cross-sectional view of a lighting device 400 including the phosphor-transparent ceramic composite plate 120 according to the embodiment of the present disclosure.

Referring to FIG. 11, the lighting device 400 according to yet another aspect of the present embodiment includes: at least one powdered inorganic phosphor dispersed in the transparent ceramic powder; and a phosphor-transparent ceramic composite plate 420 having a porosity of less than 1% formed by firing a phosphor-glass composite composition including a cross-linking agent cross-linked by heat treatment in at least two steps. Since the description of the phosphor-glass composite composition and the phosphor-glass composite plate 420 formed by firing the phosphor-glass composition has been previously performed, the description is omitted for avoiding overlapping.

The phosphor-glass composite plate 420 is packaged on an optical element 410. The optical element 410 may be a device for emitting light, and as one example, a solid light emitting element may be applied. Any one selected from among an LED, an OLED, an LD (laser diode), a laser, and a VCSEL (vertical cavity surface emitting laser) may be applied as the solid light emitting element. When the phosphor-glass composite plate is packaged on the optical element 410, the phosphor-glass composite plate 420 is mounted by interposing an adhesive layer 430 between the phosphor-glass composite plate and the optical element. The phosphor-glass composite plate 420 is mounted to the optical element 410 by applying pressure in a state of bringing the phosphor-glass composite plate 420 in contact with the optical element 410 after coating or laminating the adhesive layer 430 on one surface of the phosphor-glass composite plate 420 or on one surface of the optical element 410. The lighting device may further include an electrode 440 and a wire 442 as other constitutive elements.

With regard to the lighting device according to the present embodiment, the phosphor-transparent ceramic composite composition including 5 to 30 parts by weight of at least one powdered inorganic phosphor, and 0.2 to 15 parts by weight of the binder compound containing at least one silicate and cross-linked by heat treatment with respect to 100 parts by weight of the transparent ceramic powder is implemented, and the high strength phosphor-transparent ceramic composite plate having a porosity of less than 1% is produced via heat treatment of two steps so that physical damage can be reduced during post processes such as a grinding process, a dicing process, a packaging process and the like and in an operational environment, thereby enabling the reduction of a defect rate.

As set forth above, according to some embodiments of the present disclosure, as the ceramic phosphor plate including the first phosphor layer containing a short-wavelength phosphor and the second phosphor layer containing a long-wavelength phosphor is implemented in the transparent ceramic matrix, the amount used of the high-priced long-wavelength phosphor (red phosphor) is reduced so that a production cost can be reduced.

Also, according to some embodiments of the present disclosure, a color temperature can be easily adjusted according to each desired property, and physical properties such as a color rendering index (CRI), optical efficiency and the like can be improved.

According to some embodiments of the present disclosure, the phosphor-transparent ceramic composite composition including 5 to 30 parts by weight of at least one powdered inorganic phosphor, and 0.2 to 15 parts by weight of the binder compound containing at least one silicate and cross-linked by heat treatment with respect to 100 parts by weight of the transparent ceramic powder is implemented, and the high strength phosphor-transparent ceramic composite plate having a porosity of less than 1% is produced via heat treatment of two steps so that physical damage can be reduced during post processes such as a grinding process, a dicing process, a packaging process and the like and in an operational environment, thereby enabling the reduction of a defect rate.

As previously described, in the detailed description of the disclosure, having described the detailed exemplary embodiments of the disclosure, it should be apparent that modifications and variations can be made by persons skilled without deviating from the spirit or scope of the disclosure. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims and their equivalents.

The present disclosure has been made keeping in mind the above problems, an aspect of embodiments of the present disclosure provides a ceramic phosphor plate including a first phosphor layer containing a short-wave phosphor and a second phosphor layer containing a long-wave phosphor in a transparent ceramic matrix, wherein the ceramic phosphor plate reduces a production cost by reducing an amount used of the high-priced long-wave phosphor (red phosphor) and enables a color temperature to be easily adjusted according to each desired property, enabling the improvement of physical properties such as a color rendering index (CRI), optical efficiency and the like.

Another aspect of the embodiments of the present disclosure provides a ceramic phosphor plate that can enable the reduction of a defect rate thanks to small physical damage generated during post processes such as a grinding process, a dicing process, a drilling process, a packaging process and the like and in an operational environment by implementing a high intensity phosphor-transparent ceramic composite plate.

According to an aspect of the embodiments of the present disclosure, there is provided a ceramic phosphor plate, including: a first phosphor layer containing a short-wave phosphor in a transparent ceramic matrix; and a second phosphor layer containing a long-wave phosphor.

Also, according to another aspect of the embodiments of the present disclosure, there is provided a lighting device, including: a first phosphor layer containing a short-wave phosphor having a wavelength 510 to 580 nm in a transparent ceramic matrix; a second phosphor layer containing a long-wave phosphor having a wavelength 580 to 680 nm; and a light incoming part.

In an embodiment of the present disclosure, there is provided a phosphor-transparent ceramic composite composition including 5 to 30 parts by weight of at least one powdered inorganic phosphor, and 0.2 to 15 parts by weight of a binder compound containing at least one silicate and cross-linked by heat treatment with respect to 100 parts by weight of a transparent ceramic powder, and there is provided a ceramic phosphor plate including the phosphor-transparent ceramic composite composition.

Also, according to a further another aspect of the embodiments of the present disclosure, there is provided a phosphor-transparent ceramic composite plate formed by firing a phosphor-glass composite composition including at least one powdered inorganic phosphor dispersed in transparent ceramic powder and a cross-linking agent cross-linked by heat treatment in at least two steps.

Also, according to yet another aspect of the embodiments of the present disclosure, there is provided a lighting device including a phosphor-transparent ceramic composite plate having a porosity of less than 1% formed by firing a phosphor-glass composite composition including at least one powdered inorganic phosphor dispersed in transparent ceramic powder and a cross-linking agent cross-linked by heat treatment in at least two steps.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A ceramic phosphor plate, comprising:
a first phosphor plate containing a short-wave phosphor in a transparent ceramic matrix having a thickness of 200 to 1000 μm and a surface roughness of 0.1 to 0.3 μm, the short-wave phosphor having a wavelength of 510 to 580 nm; and
a second phosphor layer coated on one surface of the first phosphor plate,
wherein the second phosphor layer is composed of a long wave phosphor, the long wave phosphor having a wavelength of 580 to 680 nm,
wherein the second phosphor layer is patterned on the first phosphor plate to form a phosphor pattern,
wherein a color temperature (CCT) of excited light transmitted by the ceramic phosphor plate is changed based on a ratio of an area of the first phosphor plate to a total area of the phosphor pattern of the second phosphor layer,
wherein the phosphor pattern of the second phosphor layer has the total area of 20 to 35% compared to the area of the first phosphor plate so as to implement white light having a cool white color, and
wherein a luminous flux (lumens) of the ceramic phosphor plate ranges from 418.9 to 473.5, and a color temperature (CCT) of the ceramic phosphor plate ranges from 2924.6 K to 4084.1 K, and an optical efficiency ($lm/W_{rad.blue}$) of the ceramic phosphor plate ranges from 161.1 to 182.1.

2. The ceramic phosphor plate of claim 1, wherein the transparent ceramic matrix is composed of a borate-based ceramic, a phosphate-based ceramic or an aluminum oxide-based ceramic.

3. The ceramic phosphor plate of claim 1, wherein the short-wave phosphor is contained in an amount of 1 to 10 wt % in the transparent ceramic matrix.

4. The ceramic phosphor plate of claim 1, wherein the phosphor pattern is configured such that an area of each pattern ranges from 500 μm² to 10⁶ μm².

5. The ceramic phosphor plate of claim 1, wherein the short-wave phosphor is at least one inorganic phosphor selected from the group consisting of a lutetium aluminum garnet (LuAG)-based phosphor, a yttrium aluminum garnet (YAG)-based phosphor, a silicate-based phosphor, a sulfide-based phosphor, and a nitride-based phosphor.

6. The ceramic phosphor plate of claim 1, wherein the first phosphor plate or the second phosphor layer is formed by firing a phosphor-transparent composite composition containing at least one powdered inorganic phosphor dispersed in transparent ceramic powder and a cross-linking agent cross-linked by heat treatment in at least two steps, and has a porosity of less than 1%.

7. The ceramic phosphor plate of claim 6, wherein the ceramic phosphor plate has a curvature strength of 100 N/mm² or more.

8. A lighting device, comprising a ceramic phosphor plate of claim 1.

\* \* \* \* \*